(12) United States Patent
Zhong et al.

(10) Patent No.: US 11,344,840 B2
(45) Date of Patent: May 31, 2022

(54) METHOD OF PURIFYING AND RECYCLING NORMAL-PRESSURE WASTE HYDROGEN BY FULL TEMPERATURE RANGE PRESSURE SWING ADSORPTION (FTRPSA) IN MANUFACTURING PROCESS OF SEMICONDUCTOR

(71) Applicant: SICHUAN TECHAIRS CO., LTD., Sichuan (CN)

(72) Inventors: Yuming Zhong, Sichuan (CN); Yun Chen, Sichuan (CN); Kaili Liu, Sichuan (CN); Yueming Cai, Sichuan (CN)

(73) Assignee: SICHUAN TECHAIRS CO., LTD., Sichuan (CN)

( * ) Notice: Subject to any disclaimer, the term of this patent is extended or adjusted under 35 U.S.C. 154(b) by 416 days.

(21) Appl. No.: 16/419,006

(22) Filed: May 22, 2019

(65) Prior Publication Data
US 2019/0275460 A1    Sep. 12, 2019

(30) Foreign Application Priority Data
May 29, 2018    (CN) .......................... 201810533165.3

(51) Int. Cl.
*B01D 53/02*      (2006.01)
*B01D 53/047*    (2006.01)
(Continued)

(52) U.S. Cl.
CPC ..... *B01D 53/0476* (2013.01); *B01D 53/0462* (2013.01); *C01B 3/54* (2013.01);
(Continued)

(58) Field of Classification Search
CPC ............ B01D 53/0476; B01D 53/0462; B01D 2256/16; C01B 3/54; C01B 3/56; H01L 21/0228; H01L 33/005
See application file for complete search history.

(56) References Cited

U.S. PATENT DOCUMENTS

2014/0308176 A1*  10/2014  Golden ................ F25J 3/04169
                                                                           422/187
2016/0229959 A1*   8/2016  Li ............................ B01J 20/06

FOREIGN PATENT DOCUMENTS

CN          1215624 A          5/1999
CN          1952083              4/2007
(Continued)

OTHER PUBLICATIONS

Chen et al., Cause Analysis and Treatment Measures of Micro-standard Excess of CO in Pressure Swing Adsorption (PSA) Hydrogen Extraction Unit, Coal Chemical Industry, Supplementary Issue, Jul. 2013, p. 199-201.
(Continued)

*Primary Examiner* — Christopher P Jones

(57) ABSTRACT

Through the procedures of pretreatment, temperature swing adsorption (TSA) coarse desorption, pressure swing adsorption (PSA) purification and hydrogen purification, the hydrogenous waste gas from various procedures in the manufacturing process of semiconductor (especially silicon wafer), including the off-gas from chemical vapor deposition (CVD), doping (diffusion and ion implantation), photolithography and cleaning, the combusted and washed discharged gas of the off-gas in other procedures after field treatment and centralized treatment, or the hydrogenous waste gas entering the hydrogen discharge system are purified to meet the standard for the electronic grade hydrogen required for the manufacturing process of semiconductor, the recycling of hydrogen resources is realized, and the yield
(Continued)

of hydrogen is greater than or equal to 70-85%. The present invention solves the technical difficulty the normal-pressure waste hydrogen recovered in the manufacturing process of semiconductor can't be returned to the manufacturing process of semiconductor for reuse.

9 Claims, 5 Drawing Sheets

(51) Int. Cl.
    *B01D 53/04*     (2006.01)
    *C01B 3/54*     (2006.01)
    *C01B 3/56*     (2006.01)
    *H01L 21/02*     (2006.01)
    *H01L 33/00*     (2010.01)

(52) U.S. Cl.
    CPC ............ *C01B 3/56* (2013.01); *H01L 21/0228* (2013.01); *H01L 33/005* (2013.01); *B01D 2256/16* (2013.01)

(56) References Cited

FOREIGN PATENT DOCUMENTS

| CN | 101898069 A | 12/2010 |
|---|---|---|
| CN | 103111157 A | 5/2013 |
| CN | 103112823 A | 5/2013 |
| CN | 103420757 A | 12/2013 |
| CN | 104147896 A | 11/2014 |
| CN | 105854516 A | 8/2016 |

OTHER PUBLICATIONS

Li Chun-jiang, Application of pressure swing adsorption technology in hydrogen gas making form recycled rectification tail gas, China Chlor-Alkali, No. 2, Feb. 2008, p. 39-40.
Dong, Zheng, Research and Application of Hydrogen Production By Pressure Swing Adsorption, Beijing University of Chemical Technology, Professional master's thesis.
Qu et al., Discussion pressure swing adsorption technology of Butane dehydrogenation tail gas extracting hydrogen, Industry and Manufacturing, No. 3, 2015, p. 13-14.
Lou, Junze, Research and application of pressure swing adsorption hydrogen extraction process for coke oven gas, Proceedings of the 23rd Chinese National Coal Chemical, Fertilizer and Methanol Industry Development Technology Annual Conference, p. 207-210.
Shen et al., Determination of $CO_2$ Solubility in N-Methyidiethanolamine Aqueous Solution for Combination of Medium Temperature Shift with Pressure Swing Adsorption, Pehrochemical Technology, vol. 39, No. 3, 2010, p. 280-284.
Lou, Junze, Application of Coke Oven Gas Pressure Swing Adsorption Hydrogen Extraction Process in Synthetic Ammonia, China Science & Technology Overview, No. 16, 2014, p. 75.

\* cited by examiner

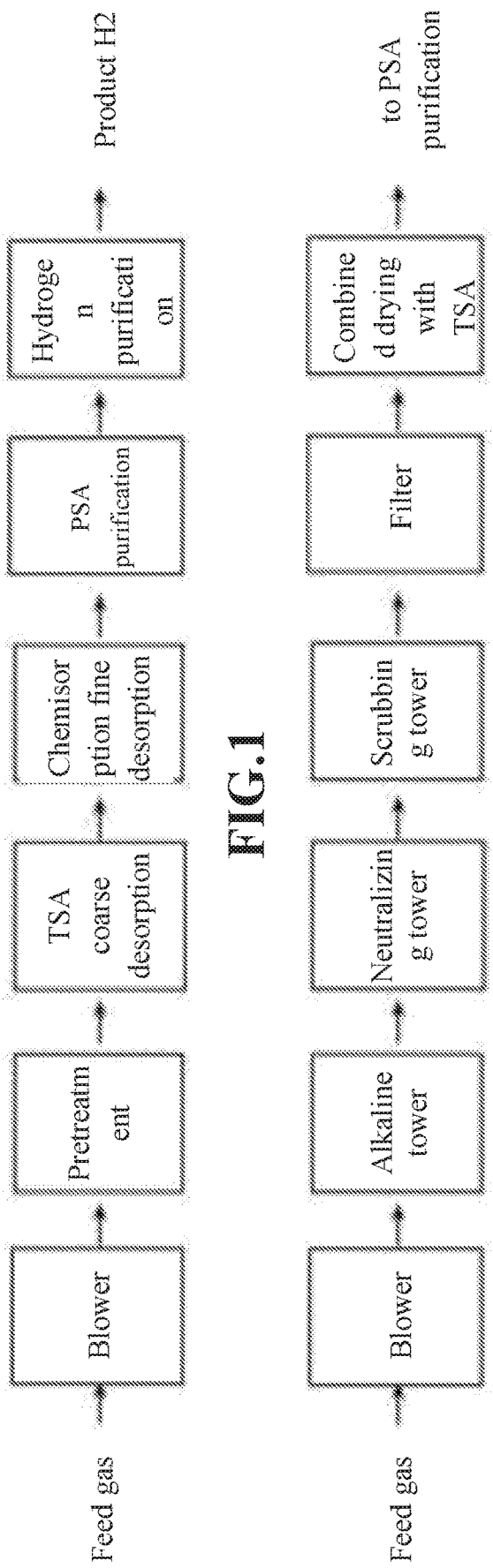

METHOD OF PURIFYING AND RECYCLING NORMAL-PRESSURE WASTE HYDROGEN BY FULL TEMPERATURE RANGE PRESSURE SWING ADSORPTION (FTRPSA) IN MANUFACTURING PROCESS OF SEMICONDUCTOR

CROSS REFERENCE OF RELATED APPLICATION

The present invention claims priority under 35 U.S.C. 119(a-d) to CN 201810533165.3, filed May 29, 2018.

BACKGROUND OF THE PRESENT INVENTION

Field of Invention

The present invention relates to the technical field of the preparation of hydrogen and the recycling of waste hydrogen in the manufacturing process of semi-conductor, in particular to a method of purifying and recycling normal-pressure waste hydrogen by full temperature range pressure swing adsorption (FTrPSA).

Description of Related Arts

Electronic grade hydrogen (PH2, hydrogen content≥99.99999% (7N), the same below) as a special gas is one of the indispensable important chemical raw materials in the industry of modern electronics, whereas the semiconductor industry is the core of the industry of modern electronics, and its manufacturing process is roughly divided into the upstream wafer manufacturing, mid-stream IC (integrated circuit) manufacturing, downstream IC packaging, and peripheral related industries of photo-mask, design, application, etc. The basis of the semiconductor industry is the silicon material industry, in which more than 90% of semiconductor devices (TFT-LCD (thin film transistor liquid crystal display), OLED, etc.) and integrated circuits, especially ultra-large-scale integrated circuits (ULSI), are manufactured on high-purity and high-quality silicon single crystal polished wafer and epitaxial wafer. In recent years, the global semiconductor industry based on wafer and silicon wafer has reached a scale of trillions of US dollars. Taking the manufacturing and OEM of silicon wafer as an example, South Korea and China have accounted for more than 60% of the industry. China's cumulative import amount of chips has exceeded $1.8 trillion US dollars in the recent decade; in 2016, it even reached nearly $230 billion US dollars, which had been more than twice of the import amount of oil as $112 billion US dollars and become the bulk product with the highest import amount in China.

A typical manufacturing process of silicon wafer, which is one of the most important and basic semiconductor materials, has 400 to 500 process steps, and 50 to 100 gases will be used. As a bulk gas, more PH2 is used, and it is one of the process gases mainly used in the manufacturing processing of silicon wafer. For example, PH2 is used as the dopant gas, epitaxial gas, gas for ion implantation, etching gas, cleaning gas, inert gas for various equipment in the manufacturing process, etc. When PH2 is used as the chemical vapor deposition (CVD) epitaxial carrier gas and shielding gas for silicon wafers, used for plasma gas cleaning, and used as a source of hydrogen molecules for synthesizing hydrogenous gases such as arsine (AsH3), phosphorane (PH3), especially in the chemical vapor deposition (CVD) process in the film preparation and epitaxial manufacturing process of silicon wafer, the purity of PH2 has a direct influence on the quality of silicon wafer.

Conventionally, there are several methods for producing PH2 using pure hydrogen or high-purity hydrogen (with the H2 content greater than 5N) as the feed gas at home and abroad, such as cryogenic (ultra-low temperature) adsorption method and palladium membrane (tube) diffusion method which are more mature in the industry, and the hydrogen purification method of hydrogen storage alloy (metal) gettering method, etc. Most of the semiconductor manufacturers obtain 5N-grade hydrogen from electrolyzed water as the raw material for producing PH2. That is, these mature methods for preparing PH2 have greater limitation on trace impurities in the hydrogen as raw material, for example, the trace impurities including oxygen monoxide (CO), chlorine (Cl), sulfur (S), ammonia (NH3), nitrogen (N2), oxygen (O2), water (H2O), etc. in the feed gas for the palladium membrane method can cause the embrittlement and poisoning of metal palladium, and thus the total content of impurities shall be less than 1-2 ppm; the contents of impurities such as total hydrocarbon (TCH), total arsenic (AsH3), total phosphorus (PH3), silane (SiH4), total chlorine (Cl), etc. in the feed gas for the metal getter method shall be all less than 0.1-0.3 ppm. Since the raw material hydrogen obtained from electrolyzed water has relatively fewer impurity components, it is easy to meet the requirements of material purchase for the hydrogen purification processes of palladium membrane, metal getter, etc.

In the manufacturing process of silicon wafer, a large amount of waste hydrogen (EH2) containing various impurity components is generated while PH2 is consumed, including the hydrogen as a reaction product produced by the silicon wafer chemical vapor deposition (CVD) film preparation and epitaxial process, the hydrogenous waste gas for cleaning the CVD reaction chamber, doped hydrogenous waste gas, photolithographic hydrogenous waste gas, hydrogenous waste gas for cleaning wafer, hydrogenous waste gas generated by combustion, wherein, the film preparation and epitaxial CVD process is one of the major sources of electronic waste hydrogen (EH2) in the manufacturing process of wafer, the output of EH2 is 1 to 5 times of the amount of fresh PH2 used in the process, which is about 20 to 60% of the total discharge of waste hydrogen (EH2). The typical composition of CND waste gas contains about 30 to 95% (volume ratio, the same below) of hydrogen (H2), more than 1 to 5% of main critical impurity components, such as flammable, explosive and toxic SiH4, PH3, AsH3, BH3, etc., and more than 5 to 10% of other impurities including TCH, N2, HCl, NH3, organic waste gas (VOCs), etc. Owing to the complex components of EH2, especially the presence of critical impurity components, it becomes quite difficult to purify and recycle EH2 back to the manufacturing process of wafer. Conventionally, most wafer foundries directly evacuate the EH2 by incorporating into the hydrogen-discharging system after the treatments of catalytic combustion and acid-base washing, or used as combustion gas, resulting in a great waste of resources.

There are problems below in the recycling technology of electronic waste hydrogen (EH2):

first, complex components in EH2: the electronic waste hydrogen to be recovered has more complex components than the teed gas for preparing fresh electron hydrogen, and other impurities generated in the manufacturing process of wafer will be introduced, including oxides, organic volatile substances, inorganic substances (such as inorganic acids, hydrogen peroxide, sulfides, chlorides, etc.) and their toxic, flammable and explosive critical impurity components (SiH4, PH3, AsH3, BH3), etc. Therefore, the volatility of impurities has a great influence on the subsequent hydrogen purification process (palladium membrane or metal getter);

second, the complex components of EH2 affecting the selection of recovery technology: the feed gas contains flammable and explosive silane (siloxane) (SiH4), the more toxic phosphorane (PH3), and the more corrosive hydrochloric acid (HCl) and ammonia (NH3/NH4OH), volatile organic vapors (VOCs), oxygen (O2), CO, CH4, water, etc.; the toxic components and the explosive and flammable impurities in the waste hydrogen shall be firstly treated and converted into harmless components or trace harmful components, and then the purification and recycling process for removing impurities shall be selected in accordance with the feed standard for hydrogen purification process. The contents of harmful components will directly affect the selection of the purification and recycling process and further determine whether the recovered hydrogen can be returned to the hydrogen purification process for use and finally whether it can be reused in the manufacturing process of s wafer. Among them, the most sensitive and critical impurity components are SiH4, PH3, AsH3, BH3, acidic compounds (HCl, etc.), basic compounds (NH3, etc.), chlorine-containing compounds (BCl3, PCl3, etc.), VOCs, photoresist and other impurity components;

third, complex source of EH2: different waste hydrogen components are produced by different processes in the manufacturing process of wafer, for example, the waste hydrogen produced in the chemical vapor deposition (CVD) and epitaxial process contains more silane, phosphorane, borane, ammonia, and it contains a great amount of waste hydrogen. The waste hydrogen discharged from the plasma hydrogen etching and cleaning (PEC/PC) process has higher contents of VOCs, water, organic impurities (especially photoresist residues); therefore, corresponding comprehensive technical solutions shall be proposed for the types and quantities of waste hydrogen produced by different manufacturing processes of semiconductor;

fourth, the front-end processing of EH2: wafer foundries are all equipped with various of electronic waste gas processing units, such as acid-base scrubbers for removing acid-base waste gas, catalytic combustion furnaces for combustible or toxic waste gases, etc. The front-end processing technologies are different for various plants, and how to use the front-end processing units, whether the pre-purification process can be effectively coupled/matched with them, whether the front-end processing technology can be reconstructed separately, etc. are also the key factors to be considered in designing the purification and recycling process;

fifth, normal pressure and room temperature or low temperature working conditions for EH2: the waste hydrogen discharged in the manufacturing process of wafer is mostly discharged through a blower after evacuation, with the working pressure close to 2 kPa and the temperature close to or lower than the room temperature or ambient temperature, as a result, the conventional separation techniques, such as pressure swing adsorption (PSA) or temperature swing adsorption (TSA), are greatly limited to be selected as the purification and recycling process and subsequent hydrogen purification process;

sixth, the existing fresh PH2 adsorption purification technology is difficult to treat EH2; for example, ultra-low temperature adsorption, palladium membrane method, metal getter method, PSA or TSA, chemisorption, etc., has the desorption ability only for some trace impurities in EH2, but it is difficult to completely desorb many complex impurity components in EH2. Therefore, EH2 can only be purified into industrial grade hydrogen and cannot be returned to the manufacturing process of wafer for reuse;

seventh, EH2 recycling shall be still implemented in strict accordance with the high standards for treating toxic, flammable and explosive chemicals; and eighth, the biggest difficulty in recycling electronic waste hydrogen is that the purification and recycling process is subject to both the front-end treatment process of EH2 and the back-end hydrogen purification process, but the front-end treatment has the greatest impact. In the wafer foundries, the existing front-end waste gas treatment process and the back-end hydrogen purification process are basically fixed, and thus the requirements are harsher for the intermediate process of waste hydrogen purification and recycling.

SUMMARY OF THE PRESENT INVENTION

The present invention provides the method of coupling various conventional physical adsorptions with chemisorptions in accordance with the physicochemical properties, relative separation coefficients, corresponding separation and purification methods, and corresponding operating conditions (temperature and pressure) of various impurity components contained in the electronic waste hydrogen (EH2) produced in the manufacturing process of wafer, so as to solve the problems of difficulty in EH2 recycling, low recovery rate, high consumption, etc.

In order to solve the above technical problems, the present invention adopts the technical schemes below:

For the method of purifying and recycling normal-pressure waste hydrogen by full temperature range pressure swing adsorption (FTrPSA) in the manufacturing process of semiconductor, the feed gas (namely normal pressure waste hydrogen) comes from the hydrogenous waste gas produced from various processes in the manufacturing process of silicon wafer, which is one of the most important and basic semiconductor materials, including the off-gas from chemical vapor deposition (CVD), doping (diffusion and ion implantation), photolithography and cleaning, the combusted and washed discharged gas of the off-gas in other procedures after field treatment and centralized treatment, or the hydrogenous waste entering the hydrogen discharge system, the main impurity components are silane and poly-silane (poly-siloxane) (SiH4), phosphorane and poly-phosphorane (PH3), arsine and poly-arsine (AsH3), borane and poly-borane (BH3) as the crucial impurity components, acidic components (HCl/H2SO4/HNO3/HF), alkaline component (NH4OH/NaOH/Ca(OH)2), ammonia (NH3), organic and volatile components (VOCs), oil mist, granules (metals, metallic oxides and organics), methane and total hydrocarbons (CH4/TCH), water and hydrogen peroxide (H2O/H2O2), carbon dioxide (CO2), low boiling carbon monoxide (CO), nitrogen (N2), oxygen (O2), nitrogen oxides (NOx) and hydrogen (H2), and other impurities, the pressure is normal pressure or less than 0.3 MPa, the temperature is room temperature or ambient temperature, and the processing method comprises following procedures of:

(1) pretreating: wherein hydrogenous waste gas produced from each procedure in a manufacturing process of wafer is used as feed gas which is sent to a pretreatment system consisting of one or more steps among alkaline washing, neutralization, water washing, drying and filtration by a blower according to acidic components, alkaline components, soluble organics, water, hydrogen peroxide, oil mist, granules, CO2 and other soluble impurities to be desorbed, and pretreatment is performed under operating conditions of a pressure from a normal pressure to 0.3 MPa and a room temperature;

(2) performing TSA coarse desorption: wherein the feed gas treated by the pretreatment procedure enters a procedure of TSA coarse desorption consisting of at least two towers to coarsely desorb SiH4, PH3, AsH3 and BH3 contained and completely desorb chlorine, sulfur, ammonia water therein and other impurities which poison a loaded active component in a procedure of chemisorption fine desorption, an adsorption temperature is the room temperature, an adsorption pressure is the normal pressure to 0.3 MPa, and the feed gas after the TSA coarse desorption enters into a next procedure; an adsorbent in the towers is selecting from a group consisting of impregnated activated carbon, activated carbon loaded with a metal/composite metal/active component, and a molecular sieve loaded with active components; the absorbent is regenerated online or offline, or is used without regeneration; a desorption and regeneration temperature for the adsorbent is 100-200° C.; after exchanging heat with the feed gas in subsequent procedures, the tail gas regenerated from the regeneration of the absorbent is directly discharged, or is used as fuel gas to enter a pipe network, or returns to the pretreatment procedure, so as to be mixed with the feed gas to further purify and recover hydrogen;

(3) performing chemisorption fine desorption: wherein the gas treated by the procedure of TSA coarse desorption exchanges heat with tail gas produced in the absorbent regeneration of the procedure of TSA coarse desorption and is then heated to 50-200° C. to enter a procedure of chemisorption fine desorption consisting of at least the two adsorption towers, the procedure of chemisorption fine desorption is performed within a temperature range of 50-200° C. and a pressure range from the normal pressure to 0.3 MPa, and the gas is controlled by chemisorptions, and a total content of SiH4, PH3, AsH3 and BH3 in the gas controlled by the chemisorption fine desorption is less than 0.1 ppm; the adsorbent filled in the adsorption towers in the procedure is selected from a group consisting of activated carbon loaded with metal oxide/composite metal oxide, molecular sieve loaded with metal oxide/composite metal oxide, modified activated carbon loaded with metal oxide/composite metal oxide and modified molecular sieve loaded with metal oxide/composite metal oxide; produced non-absorbed phase gas is a hydrogenous intermediate product as feed gas for a next procedure of PSA purification;

(4) PSA-purifying: wherein the gas treated by the procedure of chemisorption fine desorption is adjusted to 0.2-5.0 MPa and enters a procedure of multi-tower PSA purification consisting of at least 4 towers, and an operating pressure of adsorption towers is 0.2-5.0 MPa; regeneration temperatures for adsorption and desorption are both 50-200° C., wherein, at least one of the adsorption towers is in a adsorption step, the other adsorption towers are in a desorption regeneration step, and a formed non-adsorbed phase gas is ultra-pure hydrogen intermediate product with a purity of 5-6N for a next step; when regenerated, the absorbent in the absorption towers is either washed by the ultra-pure hydrogen intermediate product, or evacuated by vacuum-pumping; the adsorbent of the procedure of PSA purification is selected from a group consisting of activated alumina, silica gel, activated carbon, activated carbon loaded with active components, molecular sieves and molecular sieves loaded with active components; and (5) hydrogen-purifying: wherein the ultra-pure hydrogen intermediate product is decompressed directly or through a pressure reducing valve to a pressure required by hydrogen in the manufacturing process of the wafer at 50-500° C. and then enters into a procedure of hydrogen purification coupled by metal getter or a palladium membrane or palladium membrane-metal getter, and the ultra-pure hydrogen intermediate product is purified under an operating temperature of 50-500° C. and an operating pressure from the normal pressure to the pressure required for the hydrogen in the manufacturing process of the wafer to obtain a final electronic grade hydrogen product. The operating temperature for the procedure of hydrogen purification is determined by the process of metal getter or palladium membrane, and regeneration is not required because the service life of metal getter or palladium membrane is at least 2 years; the obtained electronic grade hydrogen product has a yield of 70-85%.

Preferably, when the total amount of the crucial impurities of SiH4, PH3, AsH3 and BH3 is less than 0.1% and other impurities are no more than 1% in the feed gas after the alkaline washing, the neutralization and the water washing of the pretreatment, the drying operation of the pretreatment may be coupled in or merged to a procedure of TSA coarse desorption so as to form a composite bed layer TSA coarse desorption system and at the same time, a filtration step of pretreatment is before or after a coupled or merged step of drying and TSA coarse desorption.

Preferably, when the total amount of the crucial impurities of SiH4, PH3, AsH3 and BH3 in the feed gas is less than 0.1% and other impurities are no more than 1%, the procedure of chemisorption fine desorption can be omitted, and the feed gas treated after either the TSA coarse desorption or the combined procedure of drying and TSA coarse desorption for pretreatment directly enters the subsequent procedure of PSA purification.

Preferably, regenerated carrier gas for the regeneration of absorbent used in the procedure of TSA coarse desorption is the tail gas produced in the absorbent regeneration of the procedure of PSA purification.

Preferably, under the working condition that impregnated activated carbon or activated carbon loaded with metallic oxides is used as the adsorbent for the procedure of TSA coarse adsorption, the adsorption capacity of the activated carbon can be further improved, but the regeneration temperature is required to be about 200° C., and hot nitrogen or hot hydrogen is used as the regenerated carrier gas which can exchange heat with the electronic grade hydrogen product produced from the procedure of hydrogen purification to obtain the regeneration temperature.

Preferably, in the procedure of chemisorption fine desorption, the absorbent may be used with or without further regeneration; if the absorbent is disposable without further regeneration, one of the two towers is in use and the other is standby, and a service life of the absorbent is longer than or equal to 1-2 years; if the absorbent is used with offline regeneration, one of the two towers is in absorption and the other is in regeneration, a regenerated temperature of the absorbent is higher than 100-200° C., nitrogen or hydrogen is used as regeneration carrier gas therein, and tail gas produced after the regeneration may be used as fuel gas to incinerators of the manufacturing procedure of wafer.

Preferably, in the procedure of PSA purification, under a condition where the absorbent regeneration is implemented by vacuum-pumping between 100-200° C., an amount of the adsorbent in the adsorption towers is increased by 5-10%. As a result, not only the yield of the electronic grade hydrogen product can be increased to be higher than 80-85%, the trace amount of the crucial impurities (SiH4, PH3, AsH3, BH3) not completed desorbed in the front-end procedure and other impurities can also be desorbed, and at the same time, energy consumption of activation in the subsequent procedure of hydrogen purification can also be reduced.

Preferably, deoxidation by a deoxidizer is also added before the procedure of PSA purification, deoxidation is performed by a high-temperature catalytic reaction at 100-200° C., by a medium-temperature catalytic reaction at 70-120° C., by chemisorptions, or by physical deoxidation; a deoxidation method is selected according to an operating temperature of the deoxidizer before and after the procedure, and the gas with the oxygen content less than 1 ppm after the deoxidation is controlled to enter the procedure of PSA purification.

Preferably, a two-stage PSA system is used in the procedure of PSA purification, and a specific operation comprises steps of: pressurizing the treated gas from the previous procedure to 02-0.3 MPa by a blower, and feeding from a bottom of a first-stage PSA tower in the procedure of PSA purification, and discharging from a top of the first-stage PSA tower to enter the next procedure for hydrogen purification; sending the desorbed gas flowing from the bottom of the first-stage PSA tower to a bottom of a second-stage PSA by a blower, and sending the rich hydrogen intermediate gas from a top of the second-stage PSA tower back to the first-stage PSA tower in order to recover hydrogen further while evacuating the desorbed gas flowing from the bottom of the second-stage PSA or used as the regenerated carrier gas for a front-end procedure of TSA coarse desorption or used as fuel gas to enter into a pipe network; an operation pressure for the adsorption of the first-stage PSA and the second-stage PSA is 0.2-0.3 MPa, and an operating temperature for the adsorption is 50-200° C.; both stages of PSA consist of at least 4 adsorption towers, respectively, at least one of the adsorption towers is in the adsorption step, and the rest of the adsorption towers are in different desorption and regeneration steps.

Preferably, the procedure of PSA purification adopts a one-stage PSA system or a two-stage PSA system, and the specific operation comprises steps of: pressurizing the gas treated from the previous process to 2.0-5.0 MPa by compression using a compressor, and sending to the one-stage PSA system or the two-stage PSA system; an adsorption pressure is 2.0-5.0 MPa, a pressure change during a cycle operation of adsorption and desorption is uniformly controlled by a procedure control valve and a regulating valve on a pipeline connected between the adsorption towers; in the two-stage PSA system performs pressurizing the desorbed gas desorbed and flowing from a bottom of a first PSA tower to 2.0-5.0 MPa by a compressor, and sending the desorbed gas to a bottom of a second PSA tower; returning the hydrogenous intermediate gas flowing from a top of the second PSA tower to the feed gas for the first PSA, and evacuating the desorbed gas flowing from the bottom of the second PSA or used as the regenerated carrier gas for a front-end procedure of TSA or used as fuel gas to enter into a pipe network.

Preferably, in the procedure of hydrogen purification, an operating temperature of the palladium membrane and the activation-free or medium-temperature activated metal getter is 50-100° C., and an operating temperature of the high-temperature activated metal getter is 300-500° C., and an operating pressure under high temperature is less than 2.0 MPa.

The feed gas involved in the present invention is normal-pressure waste hydrogen, and the hydrogenous waste gas produced from various processes in the manufacturing process of wafer includes the off-gas from chemical vapor deposition (CVD), doping (diffusion and ion implantation), photolithography, cleaning, and other processes, the combusted and washed off-gas after field treatment and centralized treatment, or the hydrogenous waste entering the hydrogen discharge system, the main impurity components are silane and poly-silane (poly-siloxane) (SiH4), phosphorane and poly-phosphorane (PH3), arsine and poly-arsine (AsH3), borane and poly-borane (BH3) as the crucial impurity components, acidic components (HCl/H2SO4/HNO3/HF), alkaline component (NH4OH/NaOH/Ca(OH)2), ammonia (NH3), organic and volatile components (VOCs), oil mist, granules (metals, metallic oxides and organics), methane and total hydrocarbons (CH4/TCH), water and hydrogen peroxide (H2O/H2O2) carbon dioxide (CO2), low boiling carbon monoxide (CO), nitrogen (N2), oxygen (O2), nitrogen oxides (NOx) and hydrogen (H2), and other impurities, the pressure is normal pressure or less than 0.3 MPa, and the temperature is room temperature or ambient temperature in the manufacturing process of wafer.

Preferably, the feed gas comes from tail-gas of a certain procedure in the manufacturing process of the semiconductor, and either a purity of recovered hydrogen is only required to be higher than 99.99% or the impurities have a strict limit; the pretreatment can be greatly simplified, the TSA coarse desorption is merged to the pretreatment or omitted, the chemisorption fine desorption is omitted or operated under a low temperature or merged to TSA coarse desorption, the hydrogen purification is omitted, and the PSA purification of one-stage or two-stage can adapt to the fluctuation of the tail gas which comes from a single different procedure and meet the purity requirement for the product hydrogen. Particularly, the semiconductor mentioned above can be light-emitting diode (LED) chips, and the feed gas may be hydrogen-containing tail gas produced by metal oxide vapor deposition (MOVCD) epitaxial or mask procedure in a manufacturing process of LED chips.

The present invention has the advantages that:

(1) For the method of purifying and recycling EH2 by full-temperature pressure swing adsorption (FTrPSA), within the range of room temperature or medium temperature (100-200° C.) and normal pressure or low pressure (0.6-0.8 MPa) for EH2 gas, the technical difficulties that the deep adsorption in the cycle operation of adsorption is difficult for regeneration and that traditional pressure swing adsorption (PSA) is difficult to directly treat the adsorption and desorption of trace impurities or the impurities with extremely small partial pressure are avoided by using the quite strong adsorption performance of different physical adsorptions and chemisorptions on the crucial impurity components and other small amount of impurity components in EH2; as a result, the cycle operation of adsorption and regeneration of the FTrPSA system within the range of room temperature or medium temperature based on various adsorption couplings can be achieved, and finally the electronic grade hydrogen product (with the hydrogen purity greater than or equal to 7-8N) can be obtained. It solves the technical bottleneck that it is difficult to recycle EH2 for the traditional adsorption and separation process;

(2) The present invention is especially suitable for working condition of greater fluctuations in the toxic, flammable and explosive crucial impurity components (SiH4, PH3, AsH3, BH3) contained in EH2; at the same time, considering safety of the processing methods, the TSA, chemisorption and PSA are coupled, the crucial impurity components and other impurity components are completely desorbed one by one to meet the requirements of feed gas specified in the final procedure of hydrogen purification, finally the qualified PH2 products can be obtained and can recycled in the manufacturing process of wafer, and the product gas yield of PH2 is greater than 70-85%;

(3) The present invention purified and recycles normal-pressure EH2, and the treatment methods of pressurization or without pressurization can be adopted according to the operating conditions of PH2 to obtain the PH2 product gas;

(4) Depending on the differences in the operating temperatures of various procedures, the present invention makes full use of the heat of the entire operating system by arranging the reasonable heat exchange system;

(5) The present invention further increases the yield of EH2 product gas to more than 80-85% by recycling the regenerated gas of TSA and PSA;

(6) According to the characteristics of various adsorption methods in the system, the present invention adopts the treatment method by concentrations for the crucial impurity components and the impurity components which are quite easy to adsorb but relatively difficult to desorb, that is, fine desorption is performed by means of one-time adsorption or off-line regeneration after TSA coarse desorption, so that the service life of the adsorbent in the procedure of fine desorption is further extended;

(7) The present invention makes full use of the variable pressure method in the procedure of PSA purification, and various traces and even trace amounts of impurity components are deeply purified and desorbed in the hydrogenous feed gas after fine desorption to avoid the failure in deep desorption of the adsorbed impurity components due to the over-low partial pressure; at the same time, it also avoids the problem that the desorption of traces or trace amount of impurity components by traditional TSA may lead to the formation of new impurity components due to the introduction of hot nitrogen regeneration or heat carrier gas in the procedure of hydrogen purification, as well as the problem of cycle operation caused by the difficulty in matching adsorption with regeneration. Accordingly, it not only ensures the feed requirement for feed gas in the procedure of hydrogen purification process, but also extends the service life of the adsorbent for the procedure of PSA purification;

(8) The present invention solves the biggest technical difficulty in the procedure of EH2 purification and recycling: the purification and recycling process is subject to both the front-end treatment process of EH2 and the back-end procedure of hydrogen purification, so that the existing procedures of front-end waste gas treatment and back-end hydrogen purification of the wafer foundry can be fully utilized to save the investment and land occupation;

(9) The present invention fills in the gap in the field of recycling normal-pressure EH2, opens up a new path for the circular economy in the semiconductor industry, and solves environmental problems of atmospheric emission.

(10) The present invention is also applicable to the extraction of hydrogen from a single off-gas from one procedure and working condition without high requirement for the purity of hydrogen products; for example, for recovery of the off-gas from the CVD procedure of silicon wafer used for LED, the feed gas has relatively simple components, thus the present invention can wash only with water for the pretreatment, the procedures of TSA coarse desorption, chemisorption fine desorption and hydrogen purification can be cancelled, and the hydrogen product with a purity of 99.999% and above can be obtained only by using the procedure of PSA purification process to be used as a carrier gas for the LED-CVD procedure or other procedures.

BRIEF DESCRIPTION OF THE DRAWINGS

FIG. 1 is a flow chart for Embodiment 1 of the present invention;

FIG. 2 is a flow chart for Embodiment 3 of the present invention;

DETAILED DESCRIPTION OF THE PREFERRED EMBODIMENT

Figure 3:
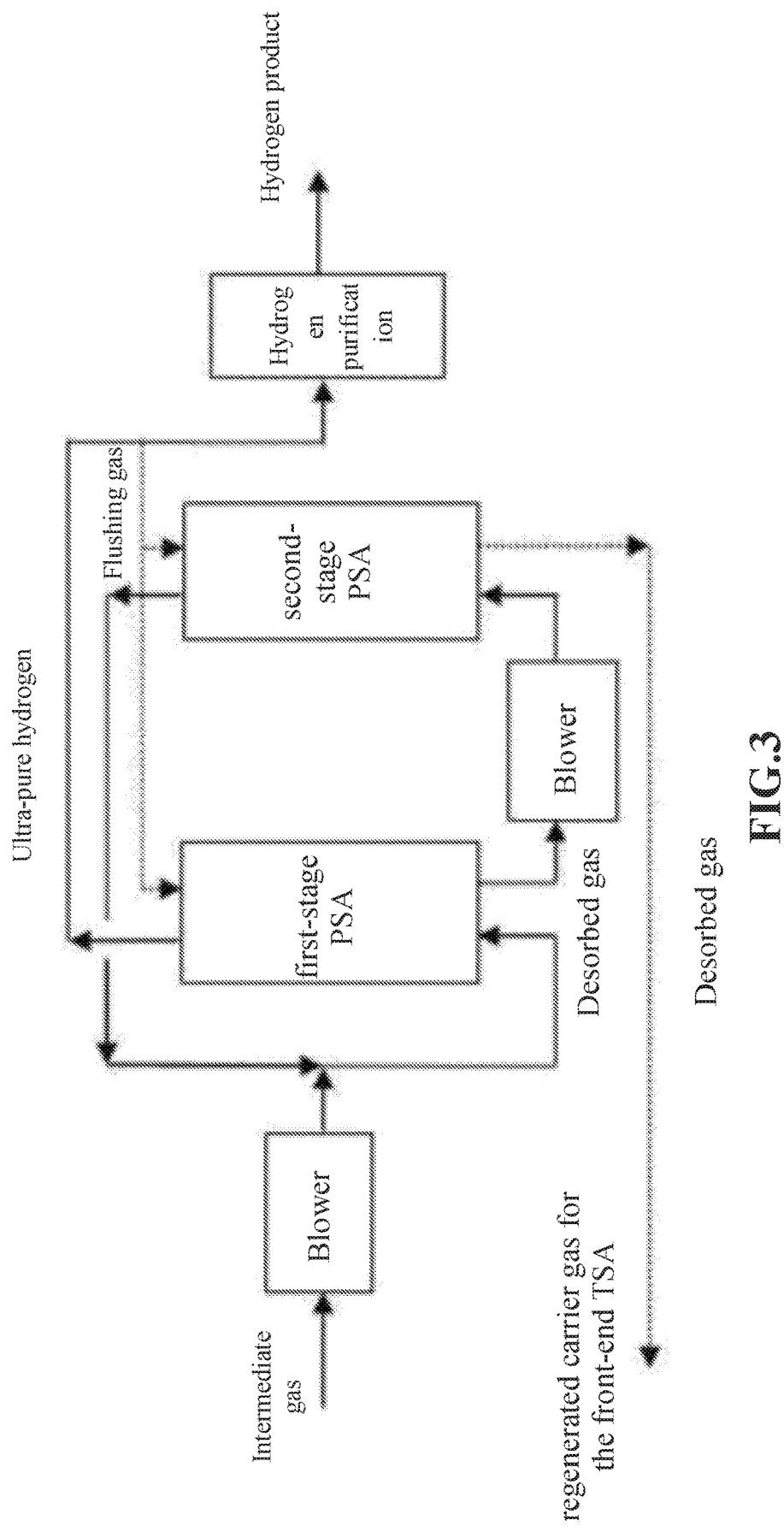
FIG. 3 is a flow chart for Embodiment 5 of the present invention.

In order to make the technicians of this field better understand the present invention, the technical schemes in the embodiments of the present invention will be clearly and completely described by combining with the drawings in the embodiments of the present invention below.

Embodiment 1

As shown in FIG. 1, the method of purifying and recycling normal-pressure waste hydrogen by full temperature range pressure swing adsorption (FTrPSA) in the manufacturing process of wafer comprises specific steps of:

(1) pretreating: wherein feed gas is sent to a pretreatment system consisting of an alkaline tower, a neutralizing tower, a scrubbing tower, a drying tower and a filter by a blower, most of acidic components, alkaline components, soluble organics (VOCs), water, hydrogen peroxide, oil mist, granules, $CO_2$ and other soluble impurities are desorbed successively to enter a next procedure, namely temperature swing adsorption (TSA);

(2) performing TSA coarse desorption: wherein the feed gas treated by the pretreatment procedure enters a procedure of TSA coarse desorption consisting of two towers to coarsely desorb $SiH_4$, $PH_3$, $AsH_3$ and $BH_3$ as crucial impurity components and serve as a protective system for subsequent procedure (chemisorption fine desorption) to completely desorb the chlorine (Cl), sulfur (S), ammonia water therein and other impurities which poison an adsorbent loaded with an active component in the subsequent procedure; by using the activated carbon impregnated with sulfur, the $PH_3$ content in the feed gas can be reduced from 0.1% to be less than 0.1-0.3 ppm, $AsH_3$ can be reduced to be less than 0.3 ppm, a desorption rate of $SiH_4$ is 60-80%, and the impregnated activated carbon can be regenerated on the line; an adsorption temperature is a room temperature, an adsorption pressure is 0.1-0.2 MPa, and the feed gas after the TSA coarse desorption enters into a next procedure, namely the chemisorptions fine desorption; an regeneration temperature for the adsorbent of the impregnated activated carbon filled in the adsorption towers for TSA coarse adsorption is 160-200° C., the regenerated carrier gas comes from tail gas produced by vacuum-pumping or reversely discharging in the subsequent procedure (PSA purification), and forms regenerated gas after the regeneration of the absorbent; a part of the regenerated gas with a low content of hydrogen is either directly discharged or used as fuel gas to enter a pipe network; most of the regenerated gas with a high content of hydrogen exchanges heat with the feed gas of the subsequent procedure of chemisorption fine desorption and then returns to the pretreatment procedure, so as to be mixed with the feed gas of the pretreatment procedure to further purify and recover hydrogen;

(3) performing chemisorption fine desorption: wherein the feed gas from the TSA coarse desorption exchanges the heat with the tail gas produce by the absorbent regeneration of the procedure of TSA coarse desorption and is then heated to 70-100° C. to enter a procedure of chemisorption fine desorption consisting of two adsorption towers and filled with the activated carbon loaded with metal oxides (CuO, HgO, CrO and Ag) as the adsorbent, the procedure of chemisorption fine desorption is conducted under a temperature of 70-100° C. and a pressure of 0.1-0.2 MPa, and concentrations of the crucial impurities that are allowed to penetrate, i.e., SiH4, AsH3 and BH3 are lower than 0.1 ppm, respectively; the adsorbent is disposable without further regeneration, one of the two towers is in use, and the other is standby; a service life of the adsorbent is longer than or equal to 2 years; wherein a main purpose of chemisorptions is the fine desorption of crucial impurity components, i.e., SiH4, PH3, AsH3 and BH3, the total amount of these impurities are controlled within a range of less than 0.1 ppm, respectively to avoid producing adverse impact on the subsequent procedure, and produced non-adsorbed phase gas is a hydrogenous intermediate product as the feed gas for the next procedure of PSA purification;

(4) PAS-purifying: wherein the hydrogenous intermediate product from the procedure of chemisorptions enters a procedure of multi-tower PSA purification consisting of 5 towers after being compressed to 1.0-1.5 MPa, an operating pressure of the adsorption towers is 1.0-1.5 MPa, an operating temperature is 70-100° C., at least one of the adsorption towers is in an adsorption step, the other four adsorption towers are in a desorption regeneration step, and formed non-adsorbed phase gas is ultra-pure hydrogen intermediate product as the feed gas to enter a next procedure, namely hydrogen purification; wherein, a hydrogen purity of the ultra-pure hydrogen intermediate product is higher than or equal to 99.999% (recorded as 5N), and contents of the rest of impurities all meet the requirements of hydrogen purification for quality limits of its feed gas; the adsorbent for the procedure of PSA purification adopts a combination of activated alumina, silica gel, activated carbon, molecular sieves/molecular sieves loaded with active components; when regenerated, the absorbent in the absorption towers is washed by the ultra-pure hydrogen intermediate product and evacuated by vacuum-pumping; the desorbed gas formed by washing, vacuumization and reverse discharge during the absorbent regeneration can be used as the regenerated carrier gas for the front-end procedure, namely the TSA coarse desorption; and (5) hydrogen-purifying: wherein the ultra-pure hydrogen intermediate product from the procedure of PSA purification after heat exchange directly enters the procedure of hydrogen purification consisting of metal getter at a temperature of 400-450° C., and is purified under an operating temperature of 400-450° C. and an operating pressure of 1.0-1.5 MPa to desorb a trace amount of impurities and obtain a final electronic grade hydrogen product; wherein a purity meets a standard for product of electronic grade hydrogen specified by Semiconductor Equipment and Materials international (SEMI), the hydrogen with the purity higher than or equal to 7-8N is cooled by heat exchange or depressurized, and then is either sent to a tank of electronic grade hydrogen products for storage or directly returned through a buffer tank for hydrogen products to a section where hydrogen is required in a manufacturing process of wafer; wherein, an operating temperature for the procedure of hydrogen purification is determined by the process of the adopted metal getter, and an absorbent regeneration is not required therein because a service life of metal getter is at least longer than 2 years; the obtained electronic grade hydrogen product has a yield higher than 70-85%.

Embodiment 2

As shown in FIG. 1, on the basis of Embodiment 1, the metal getter in the procedure of hydrogen purification is changed into (tubular) palladium membrane, the ultra-pure hydrogen intermediate product from the procedure of PSA purification directly enters the procedure of hydrogen purification consisting of the palladium membrane at the temperature of 70-100° C. and without heat exchange; it is purified under the operating temperature of 70-100° C. and the operating pressure of 1.0-1.5 MPa to desorb the trace amount of impurities and obtain the final electronic grade hydrogen product. The purity meets the standard for product of electronic grade hydrogen specified by the Semiconductor Equipment and Materials International (SEMI), the hydrogen with the purity higher than or equal to 7-8N is cooled by heat exchange or depressurized, and then it is either sent to the tank of electronic grade hydrogen product for storage or directly returned through the buffer tank for hydrogen products to the section where hydrogen is required in the manufacturing process of the wafer; wherein, the operating temperature for the procedure of hydrogen purification is determined by the adopted palladium membrane, and the absorbent regeneration is not required therein because the service life of palladium membrane is at least longer than 2 years; the obtained electronic grade hydrogen product has a yield higher than 70-85%.

Embodiment 3

As shown in FIG. 2, on the basis of Embodiment 1, the feed gas is treated by catalytic incineration and then treated by steps of using a blower, using an alkaline tower, using a neutralizing tower and using a scrubbing tower in the procedure of pretreatment; when the total amount of the crucial impurities of SiH4, PH3, AsH3 and BH3 in the feed gas after the aforesaid pretreating steps is less than 0.1% and other impurities are no more than 1%, a drying step and the TSA coarse desorption in a section of pretreatment can be combined to form a composite bed level TSA coarse desorption system, wherein, under the working condition that impregnated activated carbon is used as the adsorbent for the procedure of TSA coarse adsorption, an adsorption capacity of the activated carbon can be further improved, but the regeneration temperature is required to be about 200° C., and hot hydrogen is used as the regenerated carrier gas for the absorbent, which can exchange heat with the electronic grade hydrogen product produced from the procedure of hydrogen purification to obtain the regeneration temperature; at the same time, the filter step of the pretreatment is placed before the combined drying and TSA coarse desorption.

Embodiment 4

As shown in FIG. 2, on the basis of both Embodiment 1 and Embodiment 3, when the total amount of the crucial impurities of SiH4, PH3, AsH3 and BH3 in the feed gas is less than 0.1% and other impurities are no more than 1%, the procedure of chemisorption fine desorption can be omitted, and the feed gas treated after the combined procedure of drying and TSA coarse desorption for pretreatment directly enters the subsequent procedure of PSA purification.

Embodiment 5

As shown in FIG. 3, on the basis of Embodiment 1, for the PSA purification, the hydrogenous intermediate gas from the procedure of chemisorption fine desorption is sent to the procedure of PSA purification by a blower rather than compression, and this procedure consists of two stages of PSA systems; namely, pressurizing the hydrogenous intermediate gas to 0.2-0.3 MPa by a blower, feeding from the bottom of the first PSA adsorption tower (first-stage PSA), and discharging from a top of a first PSA tower to enter the next procedure of hydrogen purification; sending the desorbed (reverse discharged, washed) gas desorbed flowing from a bottom of a first-stage PSA tower to a bottom of a second PAS adsorption tower (second-stage PSA) by a blower, returning the rich hydrogen intermediate gas flowing from a top of the second-stage PSA tower back to the first-stage PSA tower for further recovery of hydrogen, and using the desorbed gas flowing from the bottom of the second-stage PSA as the regenerated carrier gas for the front-end procedure of TSA coarse desorption. An operation pressure for the adsorption of the first-stage PSA and the second-stage PSA is 0.2-0.3 MPa, and an operating temperature for the adsorption is 70-100° C. Each stage of PSA tower consists of 5 adsorption towers, at least one of the adsorption towers is in the adsorption step, and the rest of the adsorption towers are in different desorption and regeneration steps. Each stage of PSA adsorption tower is filled with the combination of activated alumina, silica gel, activated carbon, and molecular sieves/molecular sieves loaded with active components. This procedure can increase the yield of electronic grade hydrogen product to be higher than 80-85%.

Embodiment 6

Figure 4:
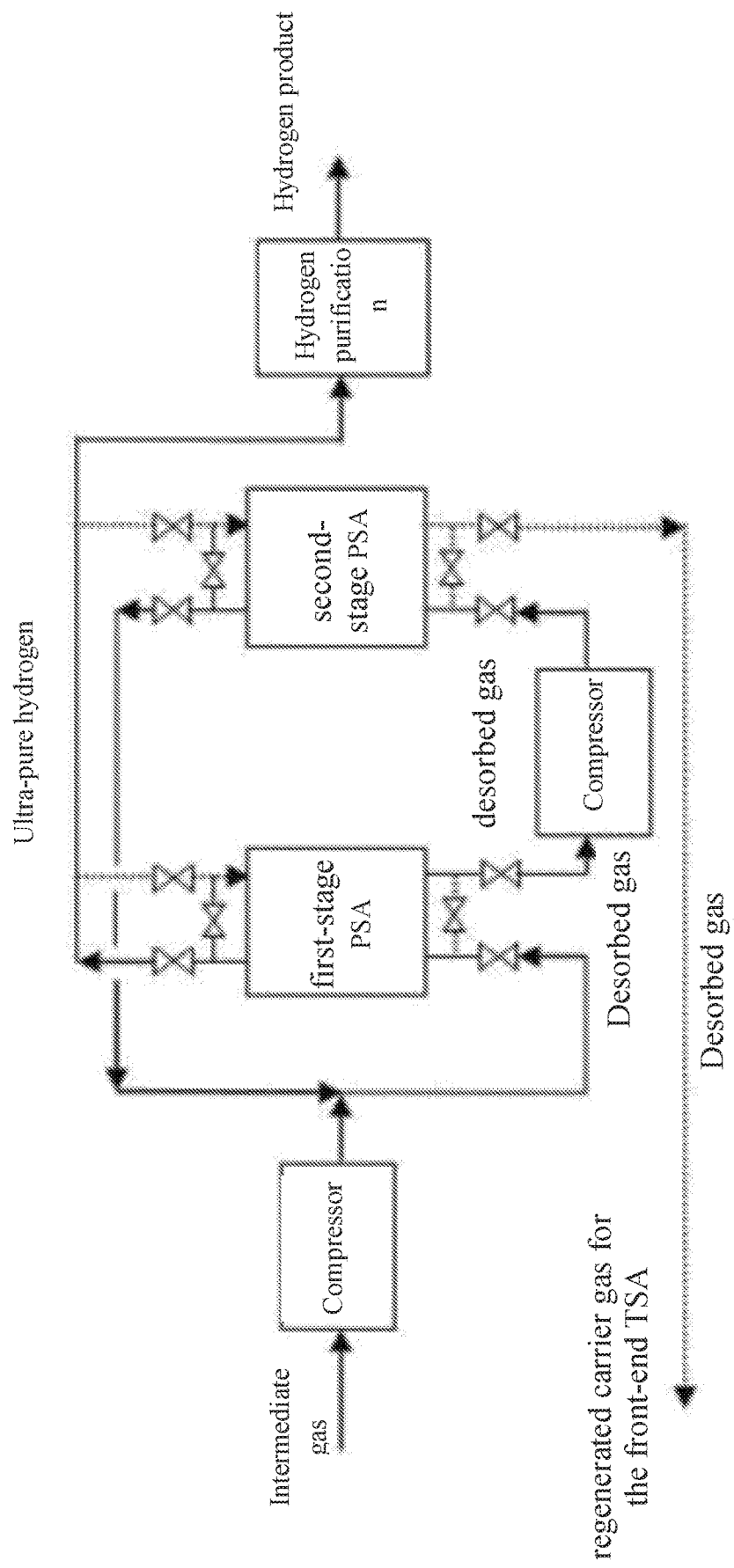
FIG. 4 is a flow chart for Embodiment 6 of the present invention.

As shown in FIG. 4, for the PSA purification, the hydrogenous intermediate gas from the procedure of chemisorptions fine desorption is pressurized to 4.0 MPa by compression and then sent to the procedure of PSA purification. A two-stage PSA system is used in this procedure, wherein an adsorption pressure is 4.0 MPa, the absorption pressure variation during a cycle operation of adsorption and desorption is slowly and uniformly controlled by procedure control valves and regulating valves on pipelines connected between the adsorption towers, in order to prevent the gas flow from flushing a bed layer of the adsorption tower and prevent pulverization of adsorbent caused by great pressure variations of the system, so that the system operation can be stable and safe in this procedure. At the same time, the two-stage PSA system performs pressurizing the desorbed (reverse discharged, washed and vacuumized) gas desorbed and flowing from the bottom of the first-stage PSA tower to 4.0 MPa by a compressor, then sending the desorbed gas to the bottom of the second PAS adsorption tower (second-stage PSA), and returning the hydrogenous intermediate gas flowing from the top of the second-stage PSA tower for further recovery of hydrogen; for the desorbed gas flowing from the bottom of the second-stage PAS tower, a part is backfilled to the tower vacuumized in the first-stage PSA, and a part is used as the regenerated carrier gas for the front-end procedure of TSA. This procedure can increase the yield of electronic grade hydrogen product to be higher than 85%.

Embodiment 7

As shown in FIG. 4, on the basis of Embodiment 1 or Embodiment 6, for the PSA purification, in case of regeneration by vacuumization with the operating temperature for the previous procedure of chemisorptions fine desorption is 100° C. and the operating temperature for the two-stage PSA is 100° C., the filling amount of the adsorbent in the first-stage PSA is appropriately increased by 5% as compared with that in Embodiment 6, and filling amount of the adsorbent in the second-stage PSA is the same as the original filling amount of the adsorbent in Embodiment 6. As a result, not only the yield of the electronic grade hydrogen product can be increased to be higher than 85%, the trace amount of the crucial impurities not completed desorbed in the front-end procedures and other impurities can also be desorbed, and at the same time, energy consumption of activation in the subsequent procedure of hydrogen purification can also be reduced.

Embodiment 8

Figures 5, 6:
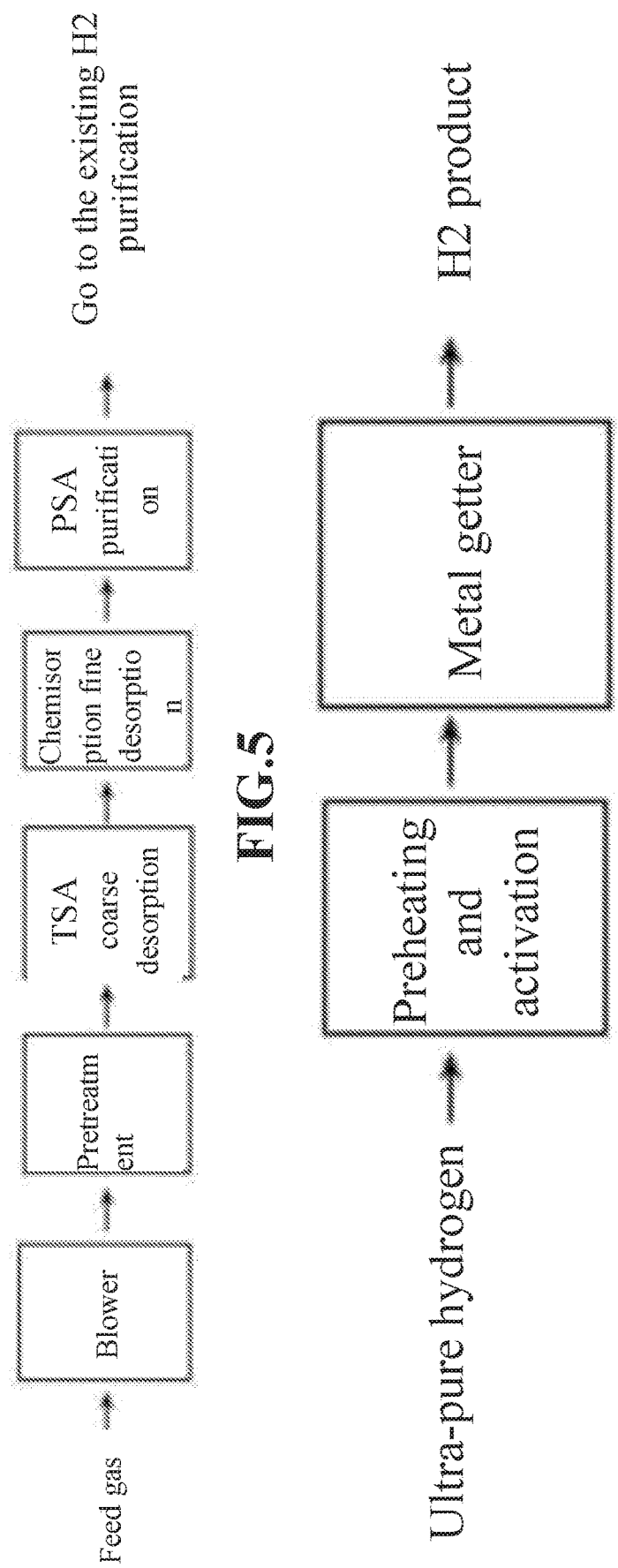
FIG. 5 is a flow chart for Embodiment 8 of the present invention.
FIG. 6 is a flow chart for Embodiment 9 of the present invention.

As shown in FIG. 5, the hydrogen purification is replaced by existing conventional hydrogen purification unit in the manufacturing process of the semiconductor.

Embodiment 9

As shown in FIG. 6, on the basis of Embodiment 1, an operating temperature for the high-temperature activated metal getter used in the hydrogen purification is 400-450° C., wherein, an operating pressure under high temperature is less than 2.0 MPa.

Embodiment 10

Figure 7:
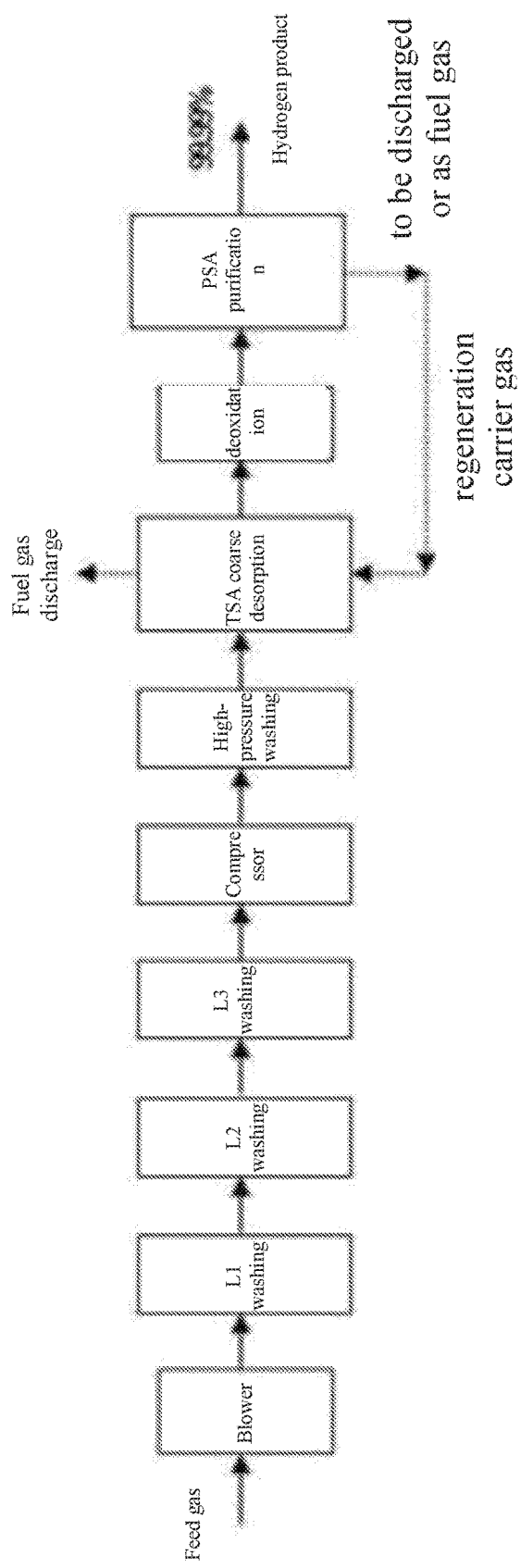
FIG. 7 is a flow chart for Embodiment 10 of the present invention.

As shown in FIG. 7, the feed gas comes from off-gas (waste hydrogen) of a certain procedure in the manufacturing process of the semiconductor, such as hydrogenous off-gas produced by metal oxide chemical vapor deposition (MOCVD) epitaxial or mask procedure in a manufacturing process of light-emitting diode (LED) chips; components of the off-gas after eluting ammonia by three-level water-washing are H2 (40%), N2 (57%), NH3 (1.4%), CH4 (1%), O2 (0.1%) and the impurities of CO, CO2, silane, hydrocarbon, water, etc., wherein, a range of fluctuation for a content of NH3 as the crucial impurity component is ±300%, a purity of the recovered hydrogen is only required to be higher than 99,99%, and flow of this embodiment based on the method can be greatly simplified: wherein, the normal-pressure and room-temperature off-gas of MOCVD enters the procedure of pretreatment through a blower to desorb the impurities of ammonia, soluble VOCs, etc. using a three-level scrubbing tower, it is pressurized to 1.6-2.0 MPa and then enters into the scrubbing tower for further desorb the ammonia in the off-gas to be less than 10-50 ppm, and the off-gas after ammonia desorption and purification enters the TSA coarse desorption to further desorb NH3, water, silane and other impurity components with greater polarity; then, it enters the deoxidizer procedure to desorb O2 to be less than 1 ppm, and finally enters the procedure of one-stage PSA purification consisting of the 5 towers; wherein, the product H2 flowing from the top of the tower has a purity higher than 99.99% and enters the hydrogen storage tank or hydrogen pipe network for use, and the yield of product H2 is greater than 70-75%; a part of the desorbed gas flowing from the bottom of the tower returns to the TSA coarse desorption as regeneration carrier gas, and a part is used as fuel gas or discharged.

Embodiment 11

Figure 8:
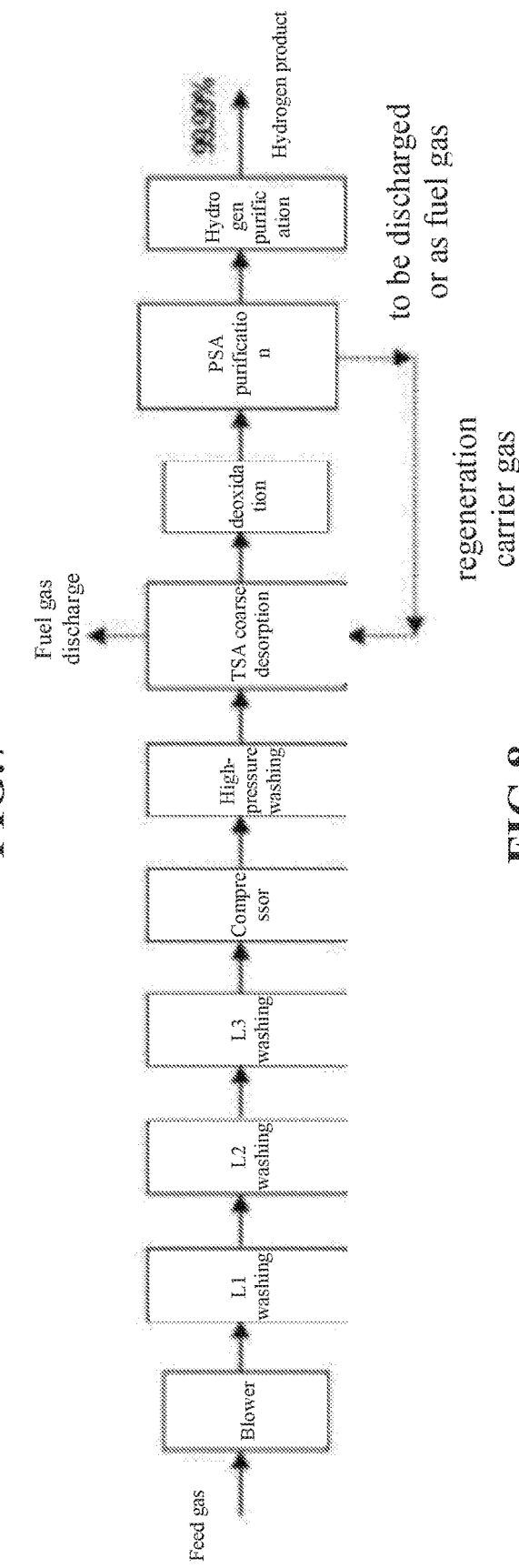
FIG. 8 is a flow chart for Embodiment 11 of the present invention.

As shown in FIG. 8, on the basis of Embodiment 10, a range of fluctuation for a content of NH3 as the crucial impurity is less than ±100%, and a purity of hydrogen product is required to be higher than 7N; the procedure of hydrogen purification of high-temperature activated metal getter is added after the flow of Embodiment 10, the hydrogen product meets the specification of 7N, and the yield of the product H2 is higher than 70-75%.

It is obviously that the above embodiments are only partial embodiment of the present invention rather than all of them. Based on the embodiments recorded in the present invention, for all the other embodiments obtained without creative labor or the structural changes under the enlightenment of the present invention by the technicians of this field, any of them with the same or similar technical scheme of the present invention will be covered by the protective scope of the present invention.

What is claimed is:

1. A method of purifying and recycling normal-pressure waste hydrogen by full temperature range pressure swing adsorption (FTrPSA), comprising following procedures of:
    (1) pretreating: wherein hydrogenous waste gas produced from wafer manufacturing is used as feed gas which is sent by a blower to a pretreatment system performing one or more steps among alkaline washing, neutralization, water washing, drying and filtration, and the pretreating is performed under operating conditions of a pressure from a normal pressure to 0.3 MPa and a room temperature;
    (2) performing TSA (temperature swing adsorption) coarse desorption: wherein the feed gas treated by the pretreatment procedure enters a device of TSA coarse desorption consisting of two towers to coarsely desorb SiH4, PH3, AsH3 and BH3 from the feed gas and completely desorb chlorine, sulfur and ammonia solution from the feed gas by adsorption with an adsorbent, an adsorption temperature is the room temperature, an adsorption pressure is the normal pressure to 0.3 MPa, a regeneration temperature for the adsorbent is within a temperature range of 100-200° C.; the adsorbent is selected from a group consisting of impregnated activated carbon, activated carbon loaded with a metal, composite metal or active component, and a molecular sieve loaded with active components;
    (3) performing chemisorption fine desorption to completely desorb SiH4, PH3, AsH3 and BH3 from the gas treated by the procedure of TSA coarse desorption: wherein the gas treated by the procedure of TSA coarse desorption exchanges heat with tail gas produced in the adsorbent regeneration of the procedure of TSA coarse desorption and is then heated to 50-200° C. to enter a device of chemisorption fine desorption consisting of two adsorption towers, the chemisorption fine desorption is performed within a temperature range of 50-200° C. and a pressure range from the normal pressure to 0.3 MPa, and the gas treated by the procedure of TSA coarse desorption is controlled by the chemisorption, and a total content of SiH4, PH3, AsH3 and BH3 in the gas controlled by the chemisorption fine desorption is less than 0.1 ppm; an adsorbent filled in the adsorption towers is selected from a group consisting of activated carbon loaded with metal oxide or composite metal oxide, molecular sieve loaded with metal oxide or composite metal oxide, modified activated carbon loaded with metal oxide or composite metal oxide and modified molecular sieve loaded with metal oxide or composite metal oxide;
    (4) PSA-purifying: wherein the gas treated by the procedure of chemisorption fine desorption is adjusted to a range of 0.2-5.0 MPa and enters a device of multi-tower PSA purification consisting of 4 towers, and an operating pressure of the 4 towers is within 0.2-5.0 MPa; adsorption and regeneration temperatures are both 50-200° C., wherein, when at least one of the 4 towers is in an adsorption step, the other of the 4 towers are in a regeneration step, and a formed non-adsorbed phase gas is ultra-pure hydrogen intermediate product; when regenerated, an adsorbent in the 4 towers is either washed by the ultra-pure hydrogen intermediate product, or evacuated by vacuum-pumping; the adsorbent of the procedure of PSA purification is selected from a group consisting of activated alumina, silica gel, activated carbon, activated carbon loaded with active components, molecular sieves and molecular sieves loaded with active components; and
    (5) hydrogen-purifying: wherein the ultra-pure hydrogen intermediate product is decompressed within a temperature range of 50-500° C. directly or through a pressure reducing valve to a pressure required by the wafer manufacturing and then enters into a procedure of hydrogen purification coupled by metal getter or a palladium membrane or palladium membrane-metal getter, and the ultra-pure hydrogen intermediate product is purified under an operating temperature within a temperature range of 50-500° C. and an operating pressure from the normal pressure to the pressure required by the wafer manufacturing to obtain a final electronic grade hydrogen product.

2. The method, according to claim 1, wherein regenerated carrier gas for the regeneration of adsorbent used in the procedure of TSA coarse desorption is tail gas produced in the adsorption of the procedure of PSA purification.

3. The method, according to claim 1, wherein deoxidation by a deoxidizer is added before the procedure of PSA purification, deoxidation is performed by a high-temperature catalytic reaction within a temperature range of 100-200° C., by a medium-temperature catalytic reaction within a temperature range of 70-100° C., by chemisorptions, or by physical deoxidation; gas with an oxygen content less than 1 ppm after the deoxidation is controlled to enter the procedure of PSA purification.

4. The method, according to claim 1, wherein a two-stage PSA system is used in the procedure of PSA purification, and a specific operation comprises steps of: pressurizing the gas treated by the procedure of chemisorption fine desorption to within 0.2-0.3 MPa by the blower, and feeding from a bottom of a first-stage PSA tower in the procedure of PSA purification, and discharging from a top of the first-stage PSA tower for hydrogen purification; sending a desorbed gas flowing from the bottom of the first-stage PSA tower to a bottom of a second-stage PSA by the blower, and sending a rich hydrogen intermediate gas from a top of a second-stage PSA tower back to the first-stage PSA tower to recover hydrogen; evacuating a desorbed gas flowing from the bottom of the second-stage PSA or using the desorbed gas flowing from the bottom of the second-stage PSA as the regenerated carrier gas for a front-end procedure of TSA coarse desorption or using the desorbed gas flowing from the bottom of the second-stage PSA as fuel gas to enter into a pipe network; an operation pressure for the adsorption of the first-stage PSA and the second-stage PSA is within 0.2-0.3 MPa.

5. The method, according to claim 3, wherein a two-stage PSA system is used in the procedure of PSA purification, and a specific operation comprises steps of: pressurizing the gas treated by the procedure of chemisorption fine desorption to within 0.2-0.3 MPa by the blower, and feeding from a bottom of a first-stage PSA tower in the procedure of PSA purification, and discharging from a top of the first-stage PSA tower for hydrogen purification; sending a desorbed gas flowing from the bottom of the first-stage PSA tower to a bottom of a second-stage PSA by the blower, and sending a rich hydrogen intermediate gas from a top of a second-stage PSA tower back to the first-stage PSA tower to recover hydrogen; evacuating a desorbed gas flowing from the bottom of the second-stage PSA or using the desorbed gas flowing from the bottom of the second-stage PSA as the regenerated carrier gas for a front-end procedure of TSA coarse desorption or using the desorbed gas flowing from the bottom of the second-stage PSA as fuel gas to enter into a pipe network; an operation pressure for the adsorption of the first-stage PSA and the second-stage PSA is within 0.2-0.3 MPa.

6. The method, according to claim 1, wherein the procedure of PSA purification adopts a one-stage PSA system or a two-stage PSA system, and the specific operation comprises steps of: pressurizing the gas treated by the procedure of chemisorption fine desorption to within 2.0-5.0 MPa by compression using a compressor, and sending pressurized gas to the one-stage PSA system or the two-stage PSA system; an adsorption pressure is within 2.0-5.0 MPa, a pressure change during a cycle operation of adsorption and desorption is uniformly controlled by a procedure control valve and a regulating valve on a pipeline connected between the adsorption towers; if the two-stage PSA system is adopted, pressurizing the desorbed gas desorbed and flowing from a bottom of a first-stage PSA tower to within 2.0-5.0 MPa by a compressor, and sending the desorbed gas to a bottom of a second-stage PSA tower; returning a hydrogenous intermediate gas flowing from a top of the second-stage PSA tower to the feed gas for the first PSA, and evacuating the desorbed gas flowing from the bottom of the second PSA or used as the regenerated carrier gas for a front-end procedure of TSA or used as fuel gas to enter into a pipe network.

7. The method, according to claim 2, wherein the procedure of PSA purification adopts a one-stage PSA system or a two-stage PSA system, and the specific operation comprises steps of: pressurizing the gas treated by the procedure of chemisorption fine desorption to within 2.0-5.0 MPa by compression using a compressor, and sending pressurized gas to the one-stage PSA system or the two-stage PSA system; an adsorption pressure is within 2.0-5.0 MPa, a pressure change during a cycle operation of adsorption and desorption is uniformly controlled by a procedure control valve and a regulating valve on a pipeline connected between the adsorption towers; if the two-stage PSA system is adopted, pressurizing the desorbed gas desorbed and flowing from a bottom of a first-stage PSA tower to within 2.0-5.0 MPa by a compressor, and sending the desorbed gas to a bottom of a second-stage PSA tower; returning a hydrogenous intermediate gas flowing from a top of the second-stage PSA tower to the feed gas for the first PSA, and evacuating the desorbed gas flowing from the bottom of the second PSA or used as the regenerated carrier gas for a front-end procedure of TSA or used as fuel gas to enter into a pipe network.

8. The method, according to claim 3, wherein the procedure of PSA purification adopts a one-stage PSA system or a two-stage PSA system, and the specific operation comprises steps of: pressurizing the gas treated by the procedure of chemisorption fine desorption to within 2.0-5.0 MPa by compression using a compressor, and sending pressurized gas to the one-stage PSA system or the two-stage PSA system; an adsorption pressure is within 2.0-5.0 MPa, a pressure change during a cycle operation of adsorption and desorption is uniformly controlled by a procedure control valve and a regulating valve on a pipeline connected between the adsorption towers; if the two-stage PSA system is adopted, pressurizing the desorbed gas desorbed and flowing from a bottom of a first-stage PSA tower to within 2.0-5.0 MPa by a compressor, and sending the desorbed gas to a bottom of a second-stage PSA tower; returning a hydrogenous intermediate gas flowing from a top of the second-stage PSA tower to the feed gas for the first PSA, and evacuating the desorbed gas flowing from the bottom of the second PSA or used as the regenerated carrier gas for a front-end procedure of TSA or used as fuel gas to enter into a pipe network.

9. The method, according to claim 1, wherein in the procedure of hydrogen purification, an operating temperature of the palladium membrane and an activation-free or a medium-temperature activated metal getter is within a temperature range of 50-100° C., and an operating temperature of a high-temperature activated metal getter is within a temperature range of 300-500° C., and an operating pressure under high temperature is less than 2.0 MPa.

* * * * *